(12) United States Patent
Wang et al.

(10) Patent No.: US 11,997,821 B2
(45) Date of Patent: May 28, 2024

(54) TRAY ASSEMBLY AND ELECTRONIC DEVICE HAVING THE SAME

(71) Applicant: WISTRON CORP., New Taipei (TW)

(72) Inventors: Jun-Hao Wang, New Taipei (TW); Yisheng Chen, New Taipei (TW); Siyun Tan, New Taipei (TW); Li Ke, New Taipei (TW)

(73) Assignee: WISTRON CORP., New Taipei (TW)

( * ) Notice: Subject to any disclaimer, the term of this patent is extended or adjusted under 35 U.S.C. 154(b) by 169 days.

(21) Appl. No.: 17/400,244

(22) Filed: Aug. 12, 2021

(65) Prior Publication Data

US 2022/0386497 A1 Dec. 1, 2022

(30) Foreign Application Priority Data

Jun. 1, 2021 (CN) .......................... 202110609240.1

(51) Int. Cl.
| | | |
|---|---|---|
| *H05K 7/14* | (2006.01) | |
| *H05K 5/02* | (2006.01) | |
| *G06F 1/18* | (2006.01) | |

(52) U.S. Cl.
CPC ........... *H05K 7/1489* (2013.01); *H05K 5/023* (2013.01); *H05K 7/1487* (2013.01); *G06F 1/183* (2013.01); *G06F 1/187* (2013.01)

(58) Field of Classification Search
CPC .... H05K 7/1489; H05K 5/023; H05K 7/1487; G06F 1/183; G06F 1/187
See application file for complete search history.

(56) References Cited

U.S. PATENT DOCUMENTS

| 5,170,320 | A | 12/1992 | Pease |
|---|---|---|---|
| 7,483,263 | B2 * | 1/2009 | Chen ...................... G06F 1/181 |
| | | | 361/679.02 |
| 9,674,978 | B2 * | 6/2017 | Wu ......................... G06F 1/185 |
| 9,826,658 | B1 | 11/2017 | Mao et al. |
| 10,251,300 | B1 | 4/2019 | Mao |
| 10,470,334 | B1 * | 11/2019 | Mao ...................... H05K 7/1489 |
| 10,487,922 | B2 * | 11/2019 | Chen ...................... F16H 19/04 |
| 10,564,685 | B2 * | 2/2020 | Chen ...................... G06F 1/185 |
| 10,827,641 | B1 * | 11/2020 | Shen .................. H05K 7/20709 |

(Continued)

FOREIGN PATENT DOCUMENTS

| CN | 108508980 | A | * | 9/2018 | ............. G06F 1/183 |
|---|---|---|---|---|---|
| CN | 108874071 | A | | 11/2018 | |
| TW | 202001483 | A | | 1/2020 | |

OTHER PUBLICATIONS

EP Office Action dated Mar. 21, 2022 in European application (No. 21197462.1-1203).

(Continued)

*Primary Examiner* — Kimberley S Wright
(74) *Attorney, Agent, or Firm* — McClure, Qualey & Rodack, LLP

(57) ABSTRACT

A tray assembly is detachably disposed on a casing and includes a tray body, at least one gear set, a handle, and at least one side cover. The tray body is adapted to be accommodated in the casing. The least one gear set is disposed at a side of the tray body. The at least one gear set has a first engagement portion configured to be engaged with the casing. The handle is rotatably connected to the tray body via the at least one gear set. The at least one side cover is fixed to the tray body and covers the at least one gear set.

19 Claims, 10 Drawing Sheets

(56) References Cited

U.S. PATENT DOCUMENTS

| | | | |
|---|---|---|---|
| 10,863,644 B1* | 12/2020 | Tseng | H05K 7/1487 |
| 11,439,033 B2* | 9/2022 | Mao | H05K 7/1457 |
| 2007/0236878 A1* | 10/2007 | Lin | G06F 1/187 |
| | | | 361/679.33 |
| 2015/0070858 A1 | 3/2015 | Wu et al. | |
| 2015/0103492 A1* | 4/2015 | Wu | H05K 7/1461 |
| | | | 361/726 |
| 2019/0138065 A1* | 5/2019 | Chen | G06F 1/185 |
| 2019/0186603 A1* | 6/2019 | Chen | F16H 19/04 |
| 2021/0385962 A1* | 12/2021 | Chang | H05K 5/023 |
| 2022/0377926 A1* | 11/2022 | Wang | H05K 7/1489 |

OTHER PUBLICATIONS

Chinese language office action dated May 3, 2022, issued in application No. TW 110121540.
IPO Office Action dated Jan. 12, 2023 in Indian application No. 202134045263.
EP Office Action dated Feb. 28, 2024 in European application No. 21197462.1-1201.

\* cited by examiner

TRAY ASSEMBLY AND ELECTRONIC DEVICE HAVING THE SAME

CROSS-REFERENCE TO RELATED APPLICATIONS

This non-provisional application claims priority under 35 U.S.C. § 119(a) on Patent Application No(s). 202110609240.1 filed in China on Jun. 1, 2021, the entire contents of which are hereby incorporated by reference.

TECHNICAL FIELD

The disclosure relates to a tray assembly, more particularly to a tray assembly including gear set and to an electronic device having the tray assembly.

BACKGROUND

A server is a platform capable of providing functionalities, such as storing, processing, and securing a huge amount of data, and therefore it plays an important role in cloud services. In a typical server, modules, assemblies, and devices employed therein are arranged in a compact manner but mostly are detachable so as to make the space utilization optimal for different applications.

For example, one or more expansion cards and related circuit board and electric components can be integrated on a tray to be assembled into a single assembly, allowing user to efficiently install or remove multiple expansion cards at a time. However, the traditional tray is simply placed in the server casing and held in position only by the casing cover, thus its position is unstable and unreliable and often out of position by external force or vibration. To solve this problem, some further use screws to fix the tray to the server casing, but this solution involves troublesome assemble and detachment processes.

SUMMARY

Accordingly, the disclosure provides a tray assembly and an electronic device having the same that are capable of solving the aforementioned problem.

One embodiment of the disclosure provides a tray assembly detachably disposed on a casing and including a tray body, at least one gear set, a handle, and at least one side cover. The tray body is adapted to be accommodated in the casing. The least one gear set is disposed at a side of the tray body. The at least one gear set has a first engagement portion configured to be engaged with the casing. The handle is pivotally connected to the tray body via the at least one gear set. The at least one side cover is fixed to the tray body and covers the at least one gear set.

Another embodiment of the disclosure provides an electronic device including a casing and a tray assembly. The casing has at least one guide pin. The tray assembly includes a tray body, at least one gear set, a handle, and at least one side cover. The at least one gear set is disposed at a side of the tray body. The at least one gear set has a first engagement portion. The handle is pivotally connected to the tray body via the at least one gear set. The at least one side cover is fixed to the tray body and covers the at least one gear set. The first engagement portion of the gear set is configured to be engaged with the at least one guide pin of the casing so that the tray assembly is detachably disposed on the casing.

Another embodiment of the disclosure provides a tray assembly including a tray body, at least one gear set, a handle, and at least one side cover. The at least one gear set is disposed at a side of the tray body. The at least one gear set includes a first gear member and a second gear member that are meshed with each other and pivotally connected to the tray body. The handle is pivotally connected to the tray body via the second gear member of the at least one gear set and movable with the first gear member. The at least one side cover is fixed to the tray body and covers the at least one gear set.

According to the tray assembly and the electronic device as discussed in the above embodiments of the disclosure, the handle is pivotally connected to the tray body via a gear set that is configured to engage with the casing, thus the installation of the tray assembly to the casing can be efficiently achieved by simply operating the handle without any additional tool. In the application that the tray assembly is served to support multiple expansion cards, the above configuration of the tray assembly enables an efficient and toolless installation of all expansion cards into the casing in one step, which is beneficial to improve the efficiency of maintenance or relevant works.

Also, the side cover of the tray assembly covers the gear set and therefore is beneficial to prevent finger pinching caused by the gear set.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1A:
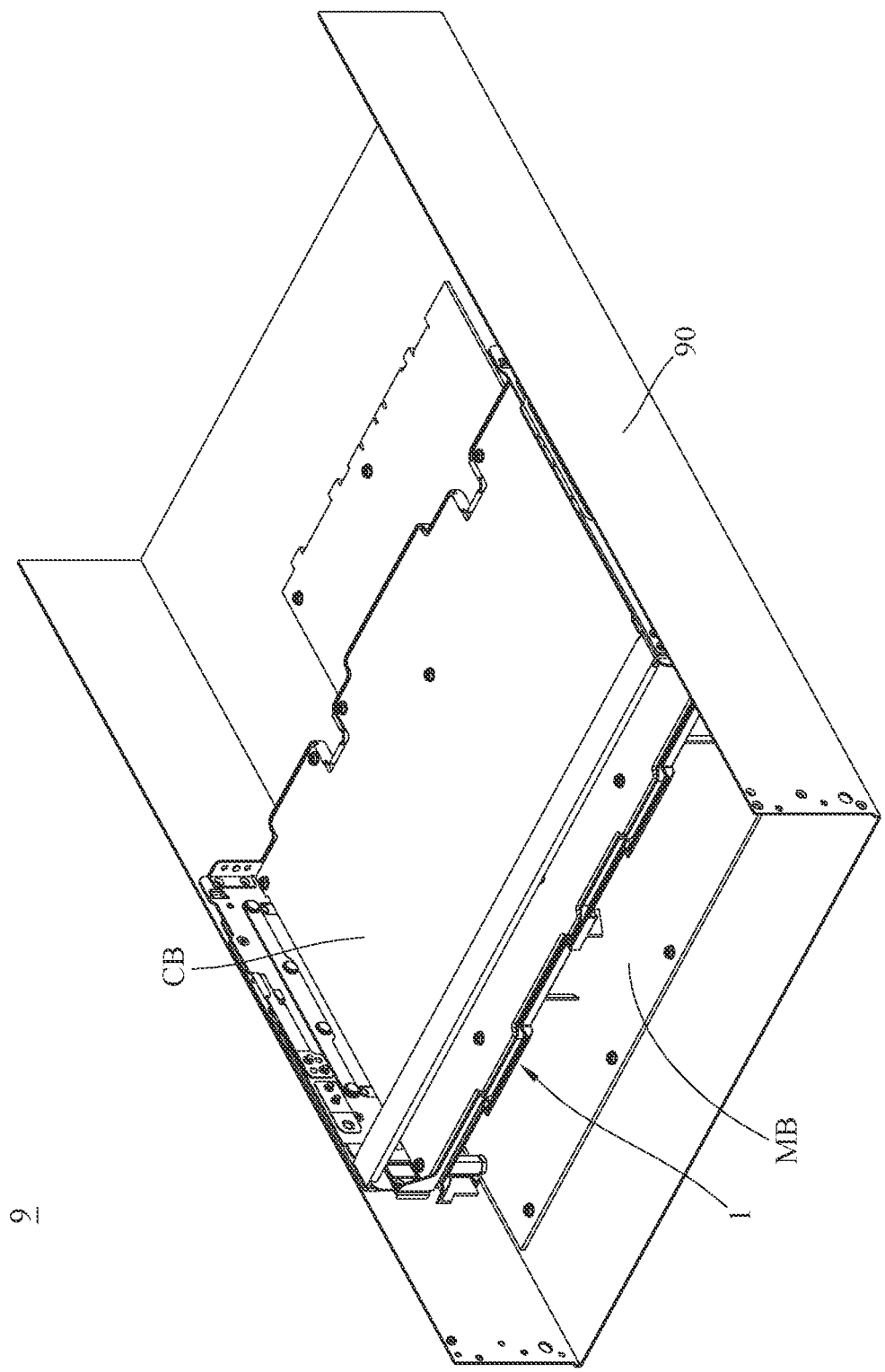
FIG. 1A is a perspective view of an electronic device according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details.

The following embodiments will be described with reference to the drawings. For the purpose of clear illustration, some conventional elements and components may be illustrated in a simple and clear manner. Some of the features in the drawings may be slightly exaggerated or illustrated in a larger proportion for the ease of viewing but are not intended to limit the disclosure. In addition, for the same reason, some of the elements or components in the drawings may be illustrated in dotted lines.

Herein, the terms, such as "end", "part", "portion", "area", may be used to refer to specific features of or between elements or components but are not intended to limit the elements and components. In addition, the terms, such as "substantially" and "approximately", as used herein may mean a reasonable amount of deviation of the described term such that the end result is not significantly changed.

Further, unless explicitly stated, the term "at least one" as used herein may mean that the quantity of the described element or component is one or larger than one but does not necessarily mean that the quantity is only one. The term "and/or" may be used herein to indicate that either or both of two stated possibilities.

Figure 1B:
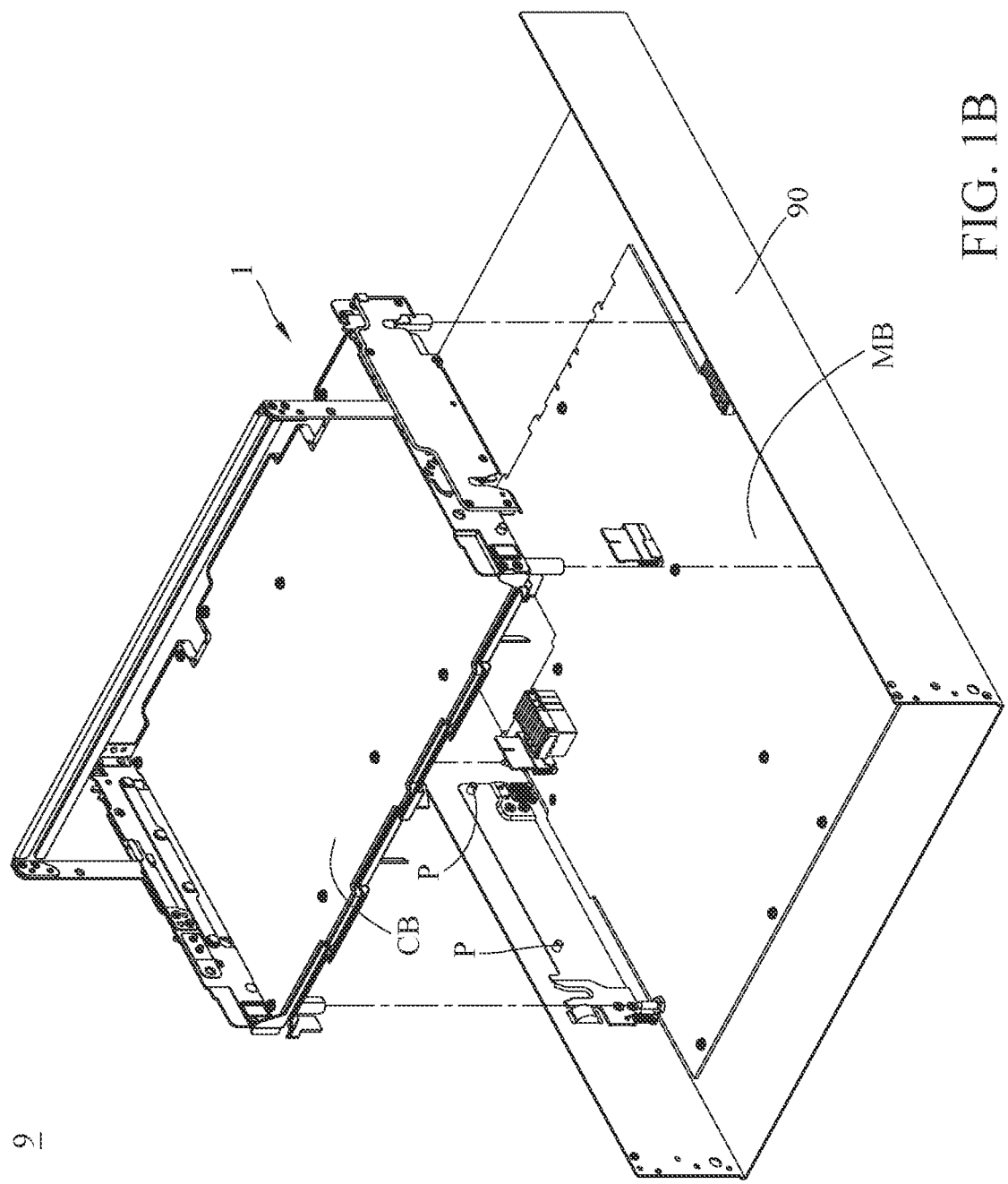
FIG. 1B is a perspective view of the electronic device in FIG. 1A when a tray assembly is taken out.

Firstly, referring to FIGS. 1A-1B, one embodiment of the disclosure provides an electronic device 9, the electronic device 9 may be, but not limited to, a computer host or a server host, but the disclosure is not limited thereto. Note that those relatively irrelevant to the spirit of the disclosure are not shown in the drawings for the purpose of simple illustration.

In this embodiment, the electronic device 9 may include a casing 90 and a tray assembly 1. The casing 90 is configured to support and accommodate the tray assembly 1 and another electronic component, assembly, case, or frame structure for other functions, such as a mainboard MB shown in the drawings. The tray assembly 1 is detachably installed in the casing 90 and is configured to support and accommodate any suitable electronic device or module for required function, such as a circuit board CB shown in the drawings. The circuit board CB is suitable for the insertion of one or more expansion cards or other added-on components (not shown). The expansion card is, for example, any typical display card. The tray assembly 1 enables an efficient and quick manner for one or multiple expansion cards to be installed in the casing 90 or removed from the casing 90. Note that the casing 90, the mainboard MB, the circuit board CB, and the expansion card are provided simply for a better understanding of the tray assembly 1 and its function but not intended to limit the disclosure, thus the disclosure is either not limited by the configuration and quantities of these components.

Figure 2:
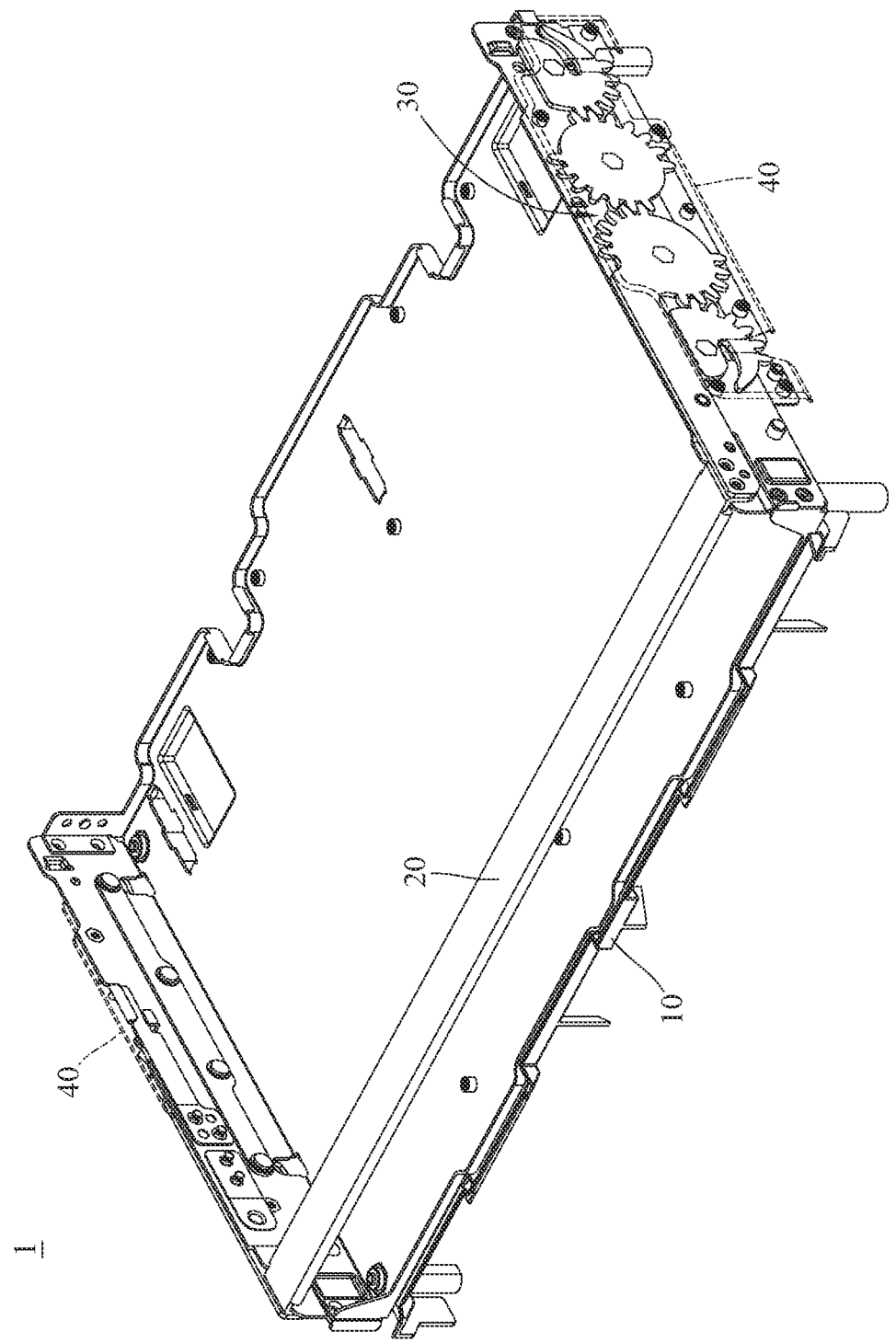
FIG. 2 is a perspective view of the tray assembly according to one embodiment of the disclosure.
Figure 3:
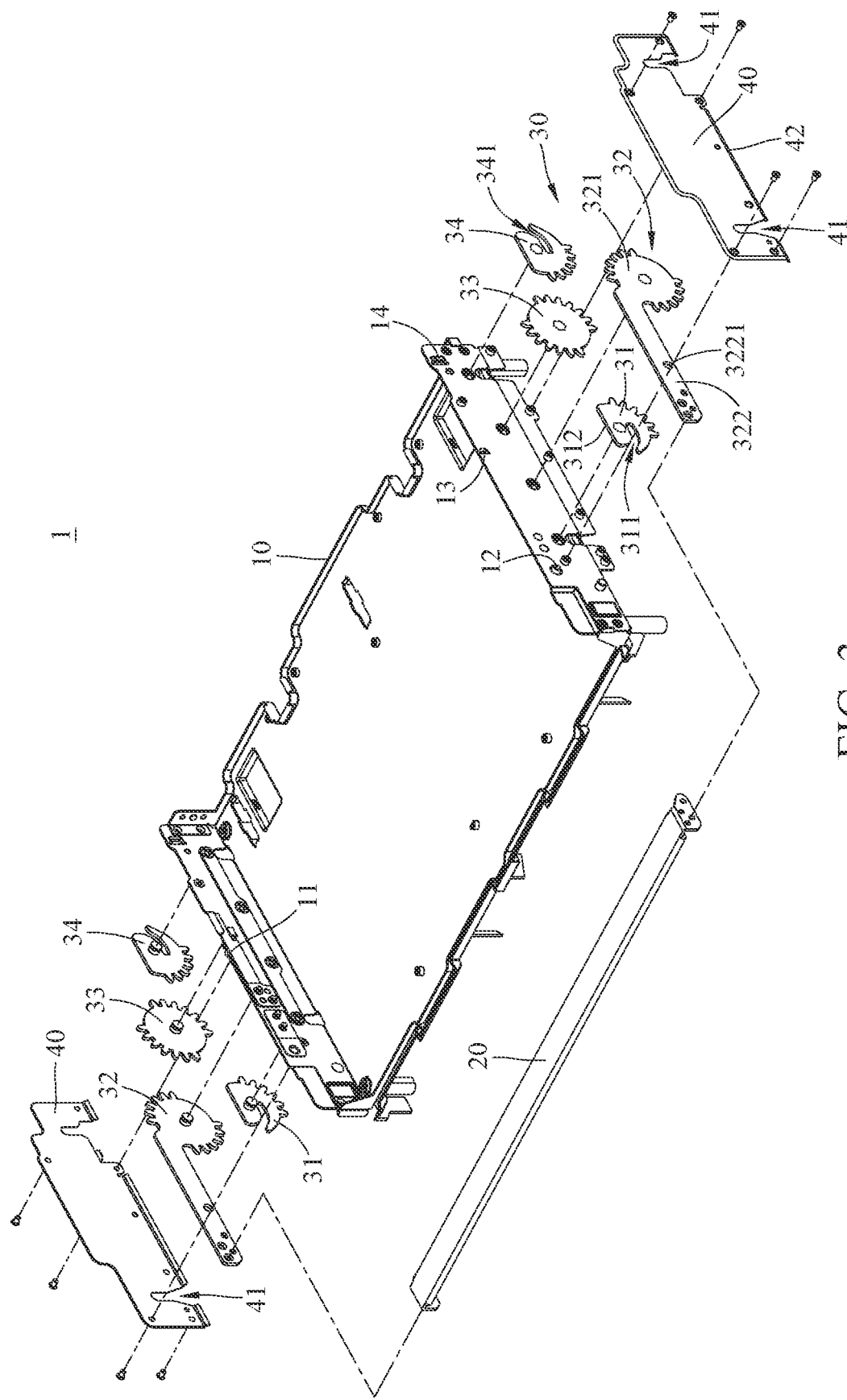
FIG. 3 is an exploded view of the tray assembly according to one embodiment of the disclosure.
Figure 4:
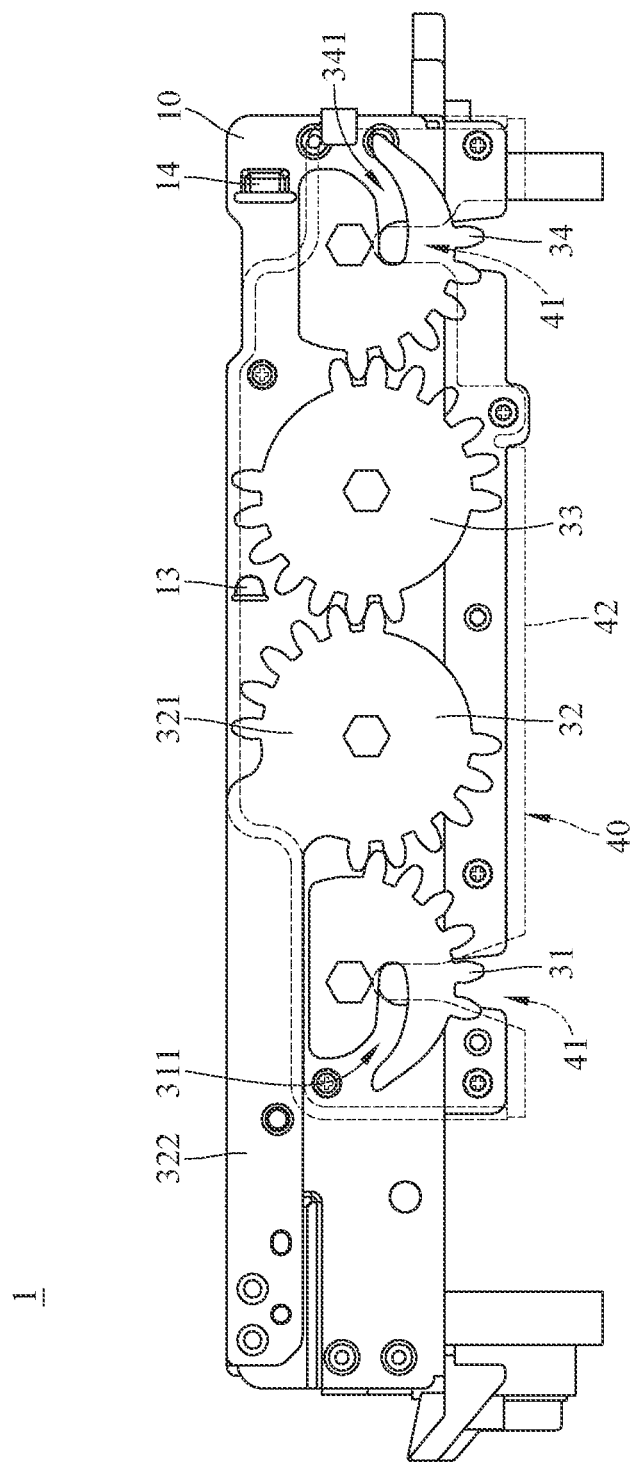
FIG. 4 is a side view of the tray assembly according to one embodiment of the disclosure.

The detail of the tray assembly 1 is provided with further reference to FIGS. 2-4, where FIG. 2 is a perspective view of the tray assembly 1, FIG. 3 is an exploded view of the tray assembly 1, and FIG. 4 is a side view of the tray assembly 1. In this embodiment, the tray assembly 1 may include a tray body 10, a handle 20, at least one gear set 30, and at least one side cover 40.

Figure 5A:
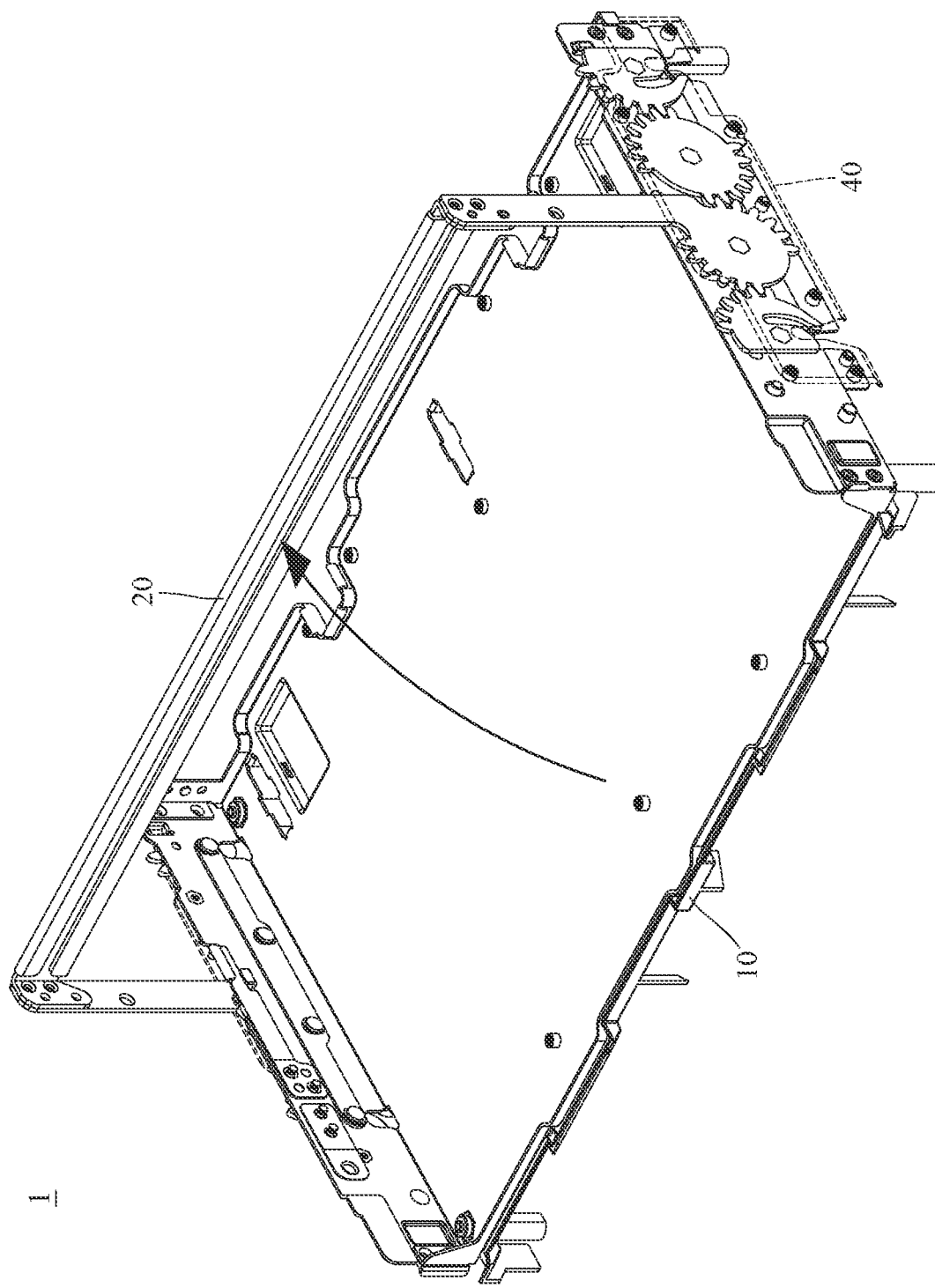
FIGS. 5A-5C depict the operation of the tray assembly according to one embodiment of the disclosure.
Figure 6A:
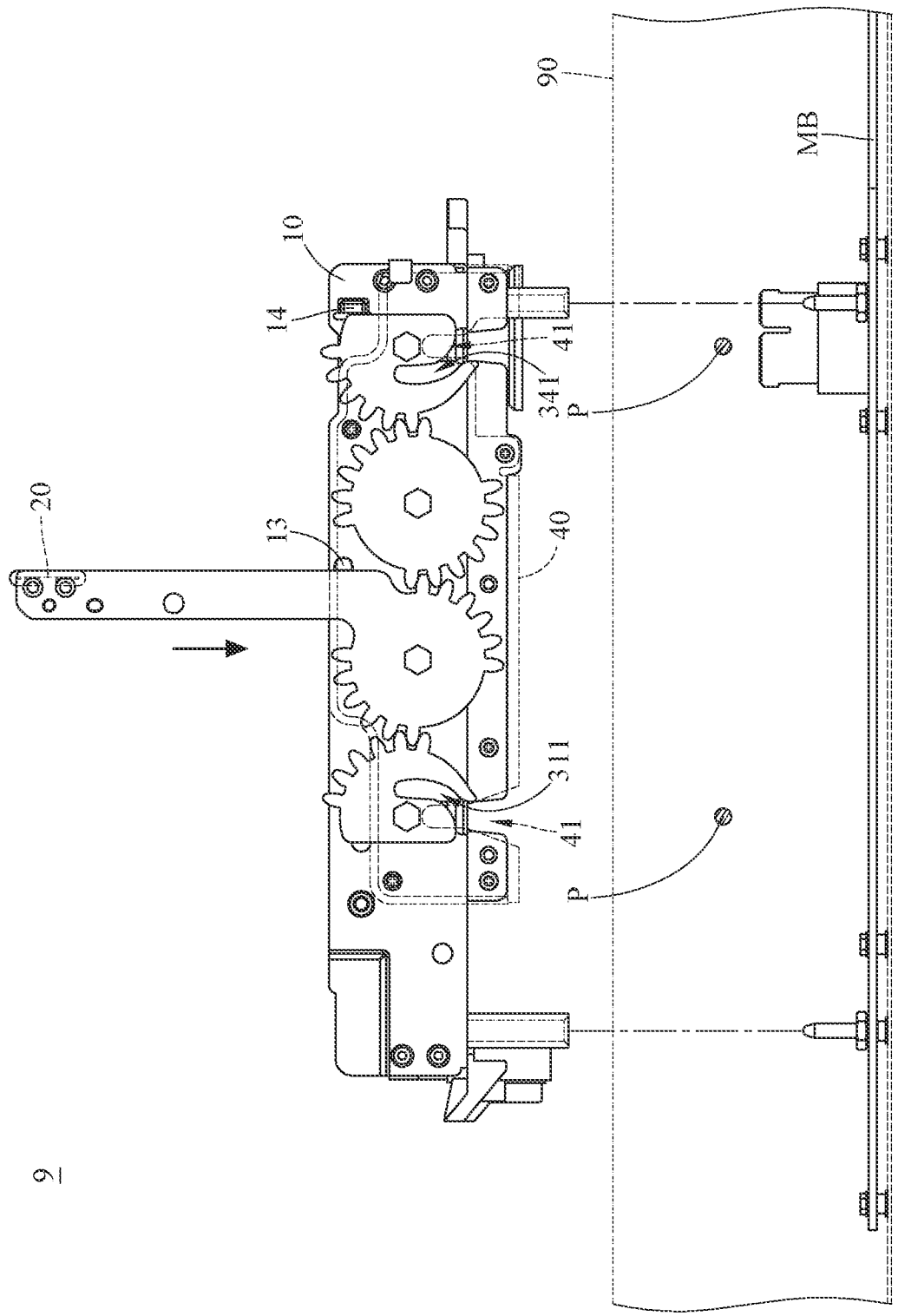
FIGS. 6A-6B depict the installation of the tray assembly into the casing.
Figure 6B:
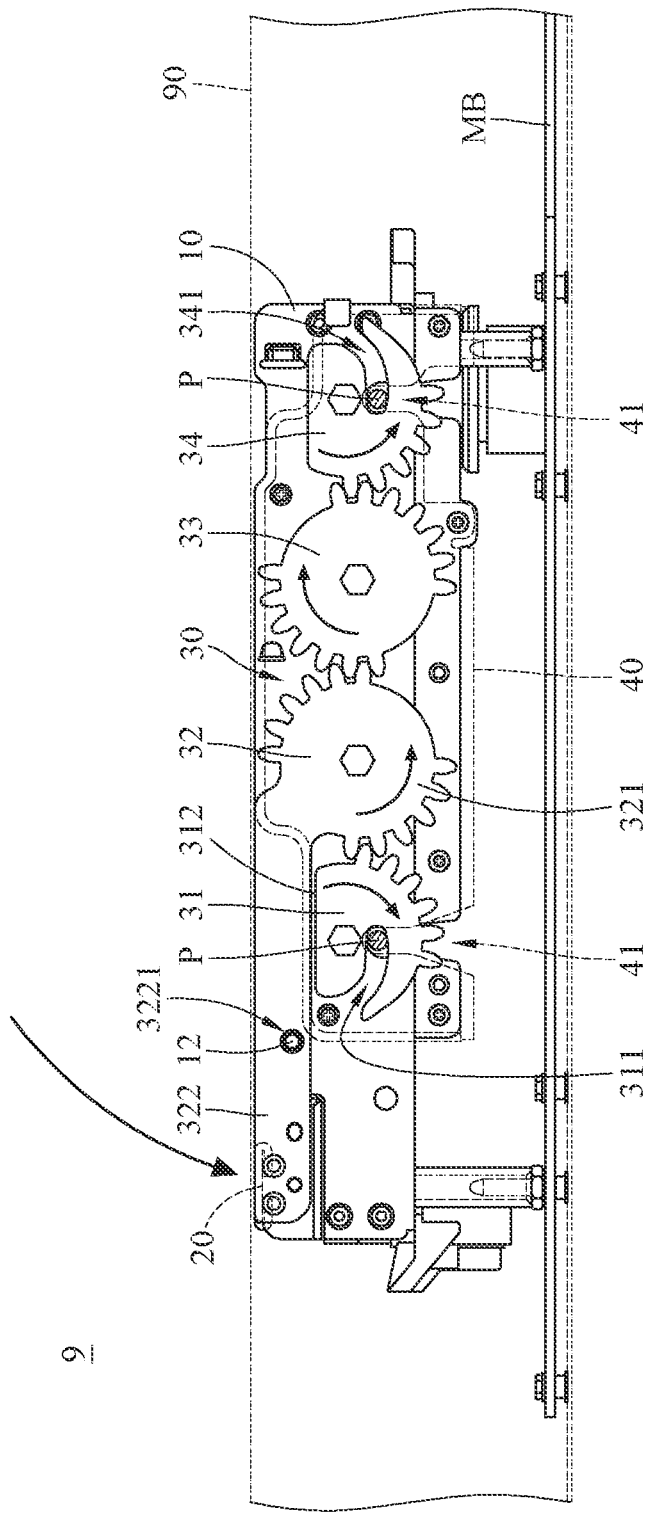

The tray body 10 is configured to support the aforementioned circuit board CB and one or more expansion card disposed on the circuit board CB. It is noted that the circuit board CB is omitted for the purpose of a clear and simple image. There are two gear sets 30 respectively disposed at two opposite sides of the tray body 10. Two opposite ends of the handle 20 are pivotally connected to the tray body 10 respectively via the gear sets 30. Thus, the handle 20 is pivotable with respect to the tray body 10 and has a lying position (as shown in FIG. 2 or FIG. 6B discussed in later paragraphs) and a standing position (as shown in FIG. 5A discussed in later paragraphs). There are two side covers 40 respectively cover the outer sides of the gear sets 30; in other words, the side cover 40 is disposed at the side of the gear sets 30 opposite to the tray body 10. Note that the gear sets 30 at the opposite sides of the tray body 10 substantially have the same configuration, and the side covers 40 are substantially mirror-reflections to each other. Thus, only one gear set 30 and one side cover 40, that are located at one side of the tray body 10, are described in further detail in the following paragraphs.

In this embodiment, the gear set 30 may include a first gear member 31, a second gear member 32, a third gear member 33, and a fourth gear member 34 that may be pivotally disposed on the tray body 10 in any suitable manner. The first gear member 31 and the third gear member 33 are respectively meshed with two opposite sides of the second gear member 32, the second gear member 32 and the fourth gear member 34 are respectively meshed with two opposite sides of the third gear member 33; in other words, the first gear member 31, the second gear member 32, the third gear member 33, and the fourth gear member 34 arranged in a line parallel to the side of the tray body 10 and any one of them can cause others to rotate as well.

In more detail, in this embodiment, the first gear member 31 may have a first engagement portion 311, the first engagement portion 311 may be a curved groove extending along a curved line whose center overlaps an axis of the first gear member 31. As shown, the curved groove has an opening formed at an edge of the first gear member 31, and the curved groove is recessed inwardly from the opening and has a closed end opposite to the opening. The phrase "recessed inwardly" used herein may indicate that the first engagement portion 311 extends in any direction away from the edge of the first gear member 31.

The second gear member 32 may include a gear portion 321 and an extension arm portion 322, the gear portion 321 is the part of the second gear member 32 being meshed with the first gear member 31 and the third gear member 33, the extension arm portion 322 extends away from the gear portion 321 in a direction away from the axis of the second gear member 32, the handle 20 is fixed to the second gear member 32 via the fixation to one end of the extension arm portion 322 so that the handle 20 is able to rotate the second gear member 32 and rotate other gear members via the second gear member 32. In this embodiment, the first gear member 31 may have a flat portion 312 at one side thereof to avoid interference with the extension arm portion 322 of the second gear member 32 (as shown in FIG. 6B discussed in later paragraphs).

The third gear member 33 is substantially the same or similar to the gear portion 321 of the second gear member 32 and therefore is not repeatedly described herein. The fourth gear member 34 is substantially the same or similar to the first gear member 31, in other words, the first gear member 31 and the fourth gear member 34 share the same configuration, which is beneficial to reduce the development cost. Thus, similarly, the fourth gear member 34 may have a second engagement portion 341, the second engagement portion 341 may be a curved groove extending along a curved line whose center overlaps an axis of the fourth gear member 34. As shown, the curved groove has an opening formed at an edge of the fourth gear member 34, and the curved groove is recessed inwardly from the opening and has a closed end opposite to the opening.

In this embodiment, the side cover 40 may be fixed to the tray body 10 and located outside of the gear set 30 in any suitable manner, such that teeth of the first gear member 31, the second gear member 32, the third gear member 33, and the fourth gear member 34 are partially or almost located between the side cover 40 and the tray body 10. This configuration is beneficial to prevent finger pinching caused by the gear set 30. The term "outside of the gear set" indicates the side of the gear set 30 opposite to or located away from the tray body 10. In addition, corresponding to the first engagement portion 311 of the first gear member 31 and the second engagement portion 341 of the fourth gear member 34, the side cover 40 may have two guide holes 41.

The guide holes 41 are recessed inwardly from an edge of the side cover 40 and therefore each has an opening at the edge of the side cover 40 and a closed end opposite to the opening. And the guide holes 41 at least expose part of the first engagement portion 311 and part of the second engagement portion 341.

Then, with reference to FIGS. 5A-5C, the operation of the tray assembly 1 is illustrated hereinafter to better understand the aforementioned detail thereof. Firstly, in FIG. 5A-5B, the handle 20 may be pivoted to the standing position as indicated by the arrow. When the handle 20 is in the standing position, the handle 20 is substantially perpendicular to the tray body 10, allowing the user to grip and carry the tray assembly 1. In addition, during the movement of the handle 20 toward the standing position, the handle 20 rotates the extension arm portion 322 and the gear portion 321 of the second gear member 32 in the same direction, and the handle 20 simultaneously rotates the first gear member 31, the third gear member 33, and the fourth gear member 34 (as indicated by the arrows). By doing so, the second gear member 32 rotates the first gear member 31 and the fourth gear member 34 to a position where the openings of both the first engagement portion 311 and the second engagement portion 341 respectively correspond to the guide holes 41 of the side cover 40.

Figure 5B:
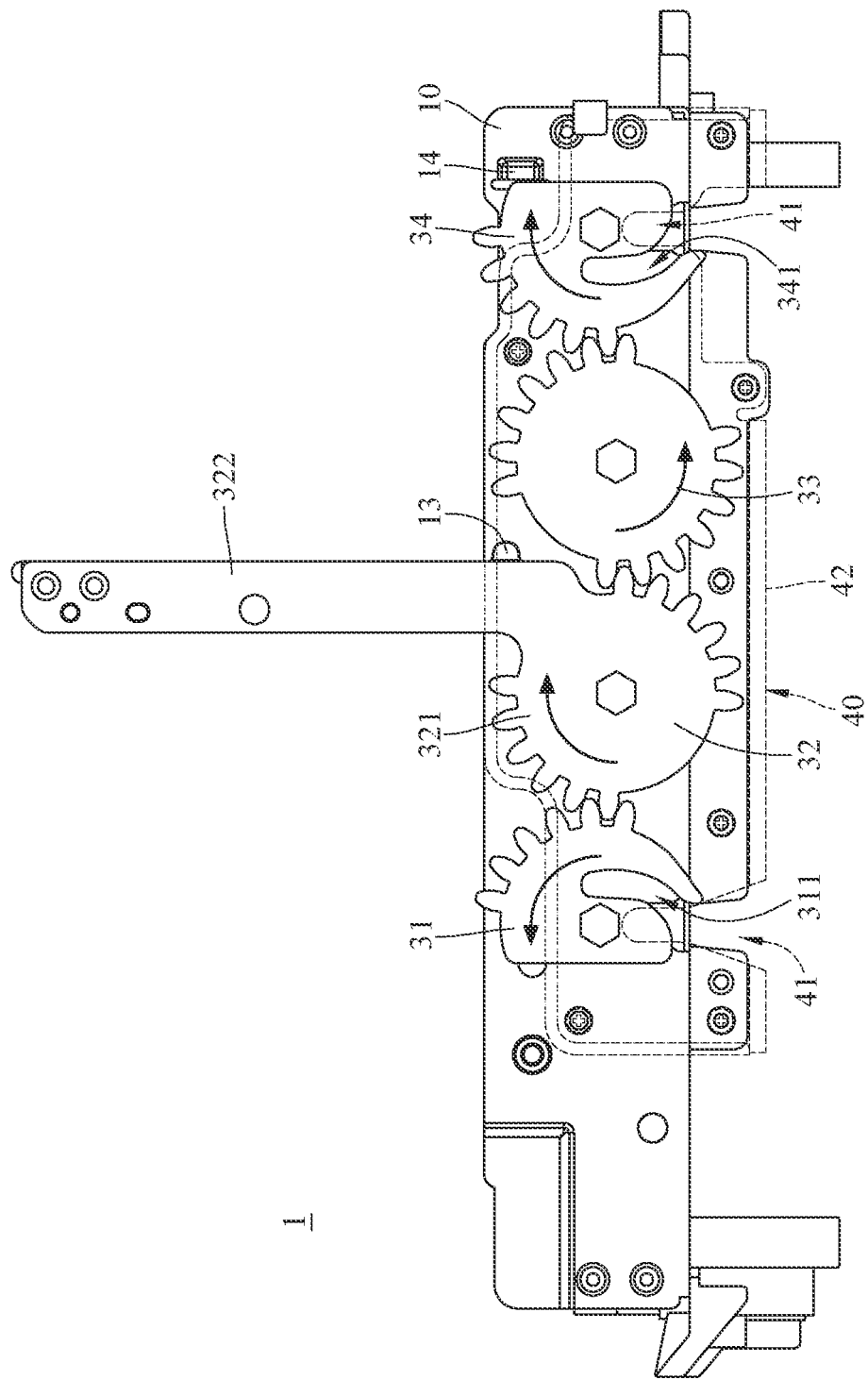
Figure 5C:
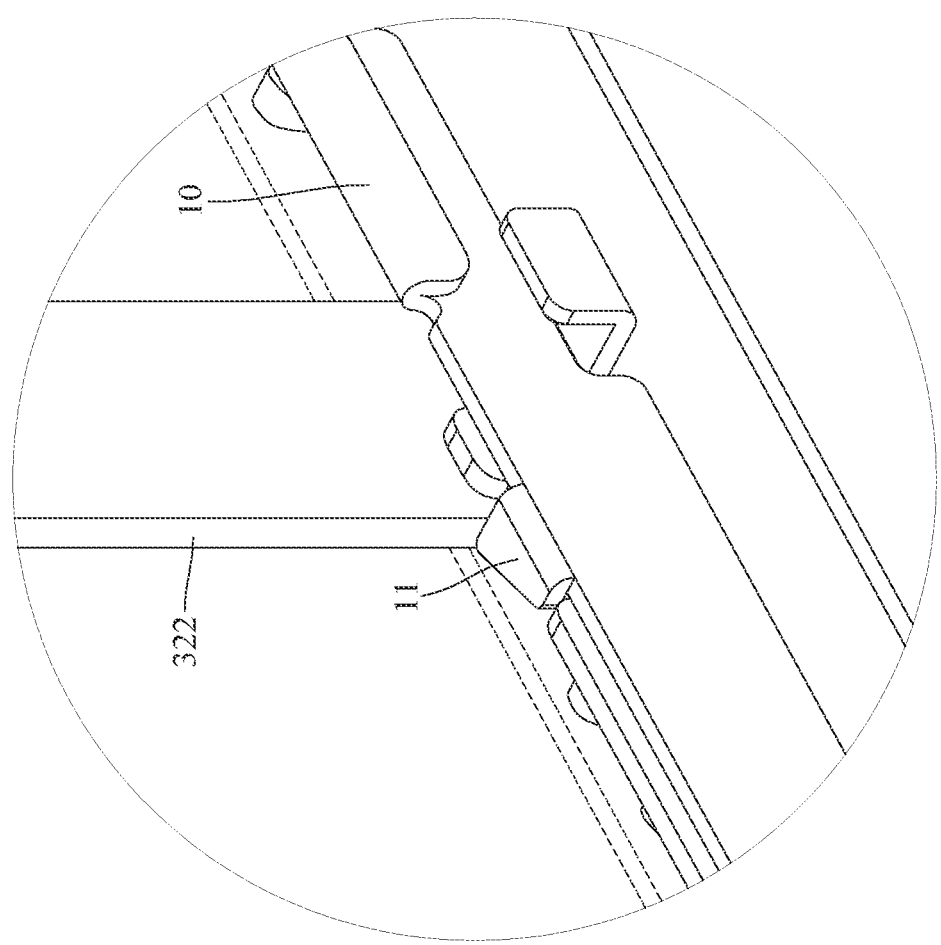

In addition, as shown in FIG. 5C, in this embodiment, the tray body 10 has at least one elastic stopper 11 protruding from sidewalls thereof. During the rotation of the handle 20 to the standing position from the lying position, the extension arm portion 322 may push and slide across the elastic stopper 11. As the handle 20 reaches the standing position, the elastic stopper 11 restores to its original shape and stops at one side of the extension arm portion 322 to hold the handle 20 in the current position, thereby preventing the handle 20 from unwantedly pivoting back to the lying position.

Further, as shown in FIGS. 3 and 5B, the tray body 10 may have a stopper structure 13 protruding therefrom, the stopper structure 13 may stop at another side of the extension arm portion 322 when the handle 20 is in the standing position to prevent the handle 20 from overly pivoted. Understandably, the elastic stopper 11 and the stopper structure 13 are able to secure the position of the handle 20 relative to the tray body 110 when the tray assembly 1 is being carried around.

In addition, as shown in FIGS. 3 and 5B, the tray body 10 may further have a stopper structure 14 protruding therefrom, the stopper structure 14 is able to stop the fourth gear member 34 at the current position when the handle 20 reaches the standing position, which indirectly helps stop the handle 20 at the standing position and prevent the handle 20 from overly pivoted. Note that the elastic stopper 11 and the stopper structures 13 and 14 may be optional and not intended to limit the disclosure.

Then, referring to FIGS. 6A-6B, the installation of the tray assembly 1 to the casing 90 is described hereinafter. For the simple and clear drawings, the casing 90 in FIGS. 6A-6B is depicted in dash lines. Firstly, as shown in FIG. 6A, user is allowed to place the tray assembly 1 into the casing 90 (as indicated by the arrow) by holding the handle 20. During this process, the guide holes 41 of the side cover 40 may be aligned with the guide pins P of the casing 90. At this moment, the openings of both the first engagement portion 311 of the first gear member 31 and the second engagement portion 341 of the fourth gear member 34 correspond to the guide holes 41, thus, while the tray assembly 1 is being placed into the casing 90 as indicated by the arrow, the guide pins P enter into the first engagement portion 311 and the second engagement portion 341 via these openings.

Also, with the cooperation of the guide pins P and the first engagement portion 311 and the second engagement portion 341, the tray assembly 1 is ensured to be installed into the casing 90 along a predetermined direction and path, thereby making the connector (not shown) of the circuit board CB on the tray body 10 precisely aligned with and connected to the connector (not numbered) of the mainboard MB. In addition, to further secure the position of the tray assembly 1 with respect to the casing 90, there may be additional mating structuring existing between the tray assembly 1 and the casing 90, but the disclosure is not limited thereto.

Then, as shown in FIG. 6B, the handle 20 may be pivoted to the lying position (as indicated by the arrow), and the handle 20 rotates the second gear member 32 and therefore rotates the first gear member 31, the third gear member 33, and the fourth gear member 34 (as indicated by the arrow). During the rotations of the first gear member 31 and the fourth gear member 34, the guide pins P move towards the closed ends of the first engagement portion 311 and the second engagement portion 341; in other words, the gear set 30 engages with the guide pins P on the casing 90 via the first gear member 31 and the fourth gear member 34. As a result, the tray assembly 1 is firmly fixed on the casing 90, and therefore secures the electrical connection between the circuit board CB and the mainboard MB.

As discussed, the tray assembly 1 enables an efficient and toolless installation of multiple expansion cards by simply operating the handle 20 thereof and therefore is beneficial to improve the efficiency of maintenance or relevant works.

Also, regarding the whole of the tray assembly 1, two gear sets 30 provide four fixing points for the tray body 10 to engage with the casing 90, improving the reliability of the tray assembly 1. However, the disclosure is not limited by the above embodiment; in some other embodiments, the tray assembly may only adopt one gear set at one side thereof to provide two fixing points for the installation according to other requirements, in such a configuration, there may be only one side cover for covering the gear set; in some other embodiments, the gear set may omit the third and fourth gear members, such that the gear set may only provide one fixing point at one side of the tray body, in such a configuration, there may be only one guide hole on the side cover.

In addition, to prevent the gear set 30 from hitting the casing 90, as shown in FIG. 2 or FIG. 4, the side cover 40 protrudes further from a bottom surface of the tray body 10 than the gear set 30. Furthermore, the side cover 40 may further have a curved edge 42 extending towards the tray body 10 and covering edges of the gear set 30. In such a configuration of the side cover 40, the sided of the gear set 30 being covered by the curved edge 42 of the side cover 40 is prevented from hitting the casing 90 while the tray assembly 1 is being placed into the casing 90. Also, the contour of the curved edge 42 may help redirect the tray assembly 1 back to the predetermined insertion path. Note that the protruding length of the side cover 40 with respect to the tray body 10 and the curved edge 42 are optional and not intended to limit the disclosure.

Furthermore, to retain the handle 20 in the lying position, as shown in FIGS. 3 and 6B, the extension arm portion 322 of the second gear member 32 may have a first retaining structure 3221, and the tray body 10 may have a second retaining structure 12 corresponding to the first retaining structure 3221, where one of the first retaining structure 3221 and the second retaining structure 12 is a protrusion, and the other one of the first retaining structure 3221 and the second retaining structure 12 is a hole mating the protrusion. As such, when the handle 20 is in the lying position, the first retaining structure 3221 and the second retaining structure 12 are able to engage with each other to retain the handle 20 in the current position. Note that the first retaining structure 3221 and the second retaining structure 12 are optional and not intended to limit the disclosure.

Moreover, the disclosure is not limited by the order of the gear members of the aforementioned gear sets; in the gear set of some other embodiments, the first to fourth gear members may be arranged in another order as required.

According to the tray assembly and the electronic device as discussed in the above embodiments of the disclosure, the handle is pivotally connected to the tray body via a gear set that is configured to engage with the casing, thus the installation of the tray assembly to the casing can be efficiently achieved by simply operating the handle without any additional tool. In the application that the tray assembly is served to support multiple expansion cards, the above configuration of the tray assembly enables an efficient and toolless installation of all expansion cards into the casing in one step, which is beneficial to improve the efficiency of maintenance or relevant works.

Also, the side cover of the tray assembly covers the gear set and therefore is beneficial to prevent finger pinching caused by the gear set.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A tray assembly, detachably disposed on a casing, comprising:
    a tray body, configure to be accommodated in the casing;
    at least one gear set, disposed at a side of the tray body, wherein the at least one gear set has a first engagement portion configured to be engaged with the casing;
    a handle, pivotally connected to the tray body via the at least one gear set; and
    at least one side cover, fixed to the tray body and covering the at least one gear set;
    wherein the at least one side cover has at least one guide hole recessed inwardly from an edge of the at least one side cover and configured for guiding one of at least one guide pin of the casing to engage with the first engagement portion.

2. The tray assembly according to claim 1, wherein the handle has a lying position and a standing position; when the handle is in the lying position, the first engagement portion of the at least one gear set is engaged with one of the at least one guide pin of the casing; when the handle is pivoted to the standing position from the lying position, the first engagement portion is disengaged from the at least one guide pin of the casing.

3. The tray assembly according to claim 1, wherein the at least one side cover protrudes further from a bottom surface of the tray than the at least one gear set.

4. The tray assembly according to claim 2, wherein the at least one gear set comprises a first gear member and a second gear member that are meshed with each other and pivotally connected to the tray body, the handle is connected to the tray body and movable with the first gear member via the second gear member, the first gear member has the first engagement portion; when the handle is pivoted to the lying position from the standing position, the handle rotates the first gear member via the second gear member so as to engage one of the at least one guide pin of the casing with the first engagement portion, thereby fixing the tray body to the casing.

5. The tray assembly according to claim 4, wherein the first gear member has a flat portion, the second gear member comprises a gear portion and an extension arm portion extending outward from the gear portion, the second gear member is meshed with the first gear member via the gear portion, the handle is connected to the gear portion via the extension arm portion; when the handle is in the lying position, the extension arm portion is located adjacent to the flat portion.

6. The tray assembly according to claim 4, wherein the at least one gear set further comprises a third gear member and a fourth gear member that are meshed with each other and pivotally connected to the tray body, the first gear member and the third gear member are respectively meshed with two opposite sides of the second gear member, the second gear member and the fourth gear member are respectively meshed with two opposite sides of the third gear member, the fourth gear member has a second engagement portion; when the handle is pivoted to the lying position from the standing position, the handle rotates the fourth gear member via the second gear member and the third gear member so as to engage another one of the at least one guide pin of the casing with the second engagement portion, thereby fixing the tray body to the casing.

7. The tray assembly according to claim 6, wherein the at least one guide hole comprises two guide holes, respectively configured for guiding the at least one guide pin to engage with the first engagement portion and the second engagement portion.

8. The tray assembly according to claim 1, wherein the at least one gear set comprises two gear sets respectively disposed at two opposite sides of the tray body, and two opposite ends of the handle are connected to the tray body respectively via the two gear sets.

9. The tray assembly according to claim 2, wherein the tray body has at least one elastic stopper protruding therefrom and configured to prevent the handle from leaving the standing position.

10. An electronic device, comprising:
    a casing having at least one guide pin; and
    a tray assembly, comprising:
      a tray body;
      at least one gear set, disposed at a side of the tray body, wherein the at least one gear set has a first engagement portion;
      a handle, pivotally connected to the tray body via the at least one gear set; and
      at least one side cover, fixed to the tray body and covering the at least one gear set;
      wherein, the first engagement portion of the gear set is configured to be engaged with the at least one guide pin of the casing so that the tray assembly is detachably disposed on the casing;
      wherein the at least one side cover has at least one guide hole recessed inwardly from an edge of the at least one side cover and configured for guiding one of the at least one guide pin of the casing to engage with the first engagement portion.

11. The electronic device according to claim 10, wherein the handle has a lying position and a standing position; when the handle is in the lying position, the first engagement portion of the at least one gear set is engaged with the at least one guide pin of the casing; when the handle is pivoted to the standing position from the lying position, the handle rotates the at least one gear set so as to disengage the first engagement portion from the at least one guide pin of the casing.

12. The electronic device according to claim 10, wherein the at least one side cover protrudes further from a bottom surface of the tray than the at least one gear set.

13. The electronic device according to claim 11, wherein the at least one gear set comprises a first gear member and a second gear member that are meshed with each other and pivotally connected to the tray body, the handle is connected to the tray body and movable with the first gear member via the second gear member, the first gear member has the first engagement portion; when the handle is pivoted to the standing position from the lying position, the handle rotates the first gear member via the second gear member so as to engage one of the at least one guide pin of the casing with the first engagement portion, thereby fixing the tray body to the casing.

14. The electronic device according to claim 13, wherein the first gear member has a flat portion, the second gear member comprises a gear portion and an extension arm portion extending outward from the gear portion, the second gear member is meshed with the first gear member via the gear portion, the handle is connected to the gear portion via the extension arm portion; when the handle is in the lying position, the extension arm portion is located adjacent to the flat portion.

15. The electronic device according to claim 13, the at least one gear set further comprises a third gear member and a fourth gear member that are meshed with each other and pivotally connected to the tray body, the first gear member and the third gear member are respectively meshed with two opposite sides of the second gear member, the second gear member and the fourth gear member are respectively meshed with two opposite sides of the third gear member, the fourth gear member has a second engagement portion; when the handle is pivoted to the lying position from the standing position, the handle rotates the fourth gear member via the second gear member and the third gear member so as to engage another one of the at least one guide pin of the casing with the second engagement portion, thereby fixing the tray body to the casing.

16. The electronic device according to claim 15, wherein the at least one guide hole comprises at least two guide holes, respectively configured for guiding the at least one guide pin to engage with the first engagement portion and the second engagement portion.

17. The electronic device according to claim 11, wherein the tray body has at least one elastic stopper protruding therefrom and configured to prevent the handle from leaving the standing position.

18. The electronic device according to claim 14, wherein the extension arm portion has a first retaining structure, the tray body has a second retaining structure, one of the first retaining structure and the second retaining structure is a protrusion, another one of the first retaining structure and the second retaining structure is a hole mating the protrusion; when the handle is in the lying position, the first retaining structure is engaged with the second retaining structure.

19. A tray assembly, comprising:
a tray body;
at least one gear set, disposed at a side of the tray body, wherein the at least one gear set comprises a first gear member and a second gear member that are meshed with each other and pivotally connected to the tray body, and the first gear member has a first engagement portion configured to be engaged with a casing;
a handle, rotatably connected to the tray body via the second gear member of the at least one gear set and movable with the first gear member; and
at least one side cover, fixed to the tray body and covering the at least one gear set;
wherein the at least one side cover has at least one guide hole recessed inwardly from an edge of the at least one side cover and configured for guiding one of at least one guide pin of the casing to engage with the first engagement portion.

* * * * *